United States Patent
Sakai et al.

(10) Patent No.: US 7,358,180 B2
(45) Date of Patent: Apr. 15, 2008

(54) METHOD OF FORMING WIRING STRUCTURE AND SEMICONDUCTOR DEVICE

(75) Inventors: Hisaya Sakai, Kawasaki (JP); Noriyoshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 10/927,006

(22) Filed: Aug. 27, 2004

(65) Prior Publication Data
US 2005/0194691 A1 Sep. 8, 2005

(30) Foreign Application Priority Data
Mar. 8, 2004 (JP) ............................ 2004-064486

(51) Int. Cl.
*H01L 21/28* (2006.01)
(52) U.S. Cl. ............... 438/637; 438/687; 257/E21.585
(58) Field of Classification Search ............... 438/687, 438/622, 625–629, 637–638; 257/E21.575, 257/E21.585
See application file for complete search history.

(56) References Cited

U.S. PATENT DOCUMENTS

| | | | |
|---|---|---|---|
| 5,354,712 A | 10/1994 | Ho et al. | |
| 6,335,570 B2 | 1/2002 | Mori et al. | |
| 6,642,146 B1 | 11/2003 | Rozbicki et al. | |
| 2003/0075752 A1* | 4/2003 | Motoyama | 257/306 |
| 2004/0137714 A1* | 7/2004 | Friedemann et al. | 438/627 |

FOREIGN PATENT DOCUMENTS

JP 2004-153162 5/2004

OTHER PUBLICATIONS

Office Action dated May 12, 2006, issued in corresponding China application No. 200410012028.3.
Office Action dated May 11, 2006, issued in corresponding Taiwanese application No. 93126023.

* cited by examiner

*Primary Examiner*—Thanhha S. Pham
(74) *Attorney, Agent, or Firm*—Westerman, Hattori, Daniels & Adrian, LLP.

(57) ABSTRACT

A micronized wiring structure is obtained by optimizing film forming modes of barrier metal films as being adapted respectively to a via-hole and a wiring groove, wherein sputtering processes are adopted herein, which are specifically the multi-step sputtering process for formation of the barrier metal film over the via-hole, and the one-step, low-power sputtering process for formation of the barrier metal film over the wiring groove, to thereby realize improved electric characteristics such as via-hole resistance and wiring resistance, and improved wiring reliabilities such as Cu filling property and electro-migration resistance.

9 Claims, 8 Drawing Sheets

SPUTTERING FILM FORMATION PROCESS
AND COVERAGE MORPHOLOGY

LONG SLOW SPUTTERING PROCESS

BIAS SPUTTERING PROCESS

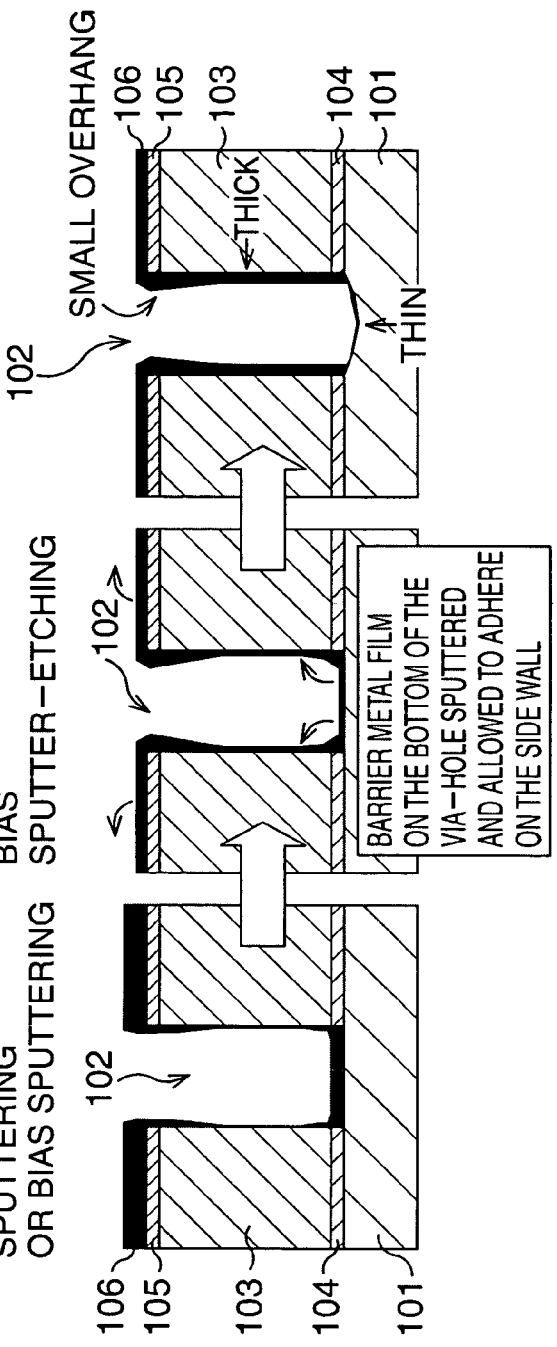
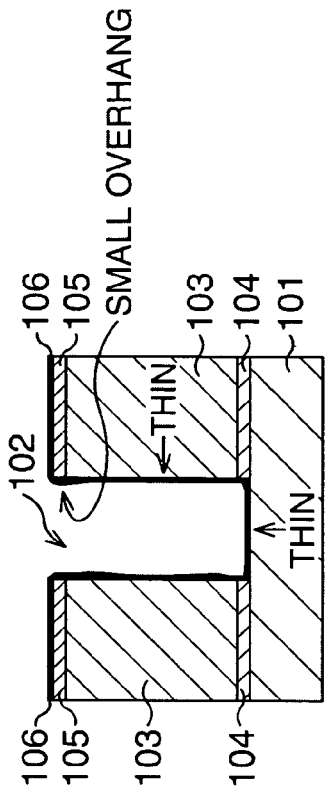
FIG. 2A SPUTTERING FILM FORMATION PROCESS AND COVERAGE MORPHOLOGY
MULTI-STEP SPUTTERING PROCESS
FIG. 2B ONE-STEP, LOW-POWER SPUTTERING PROCESS

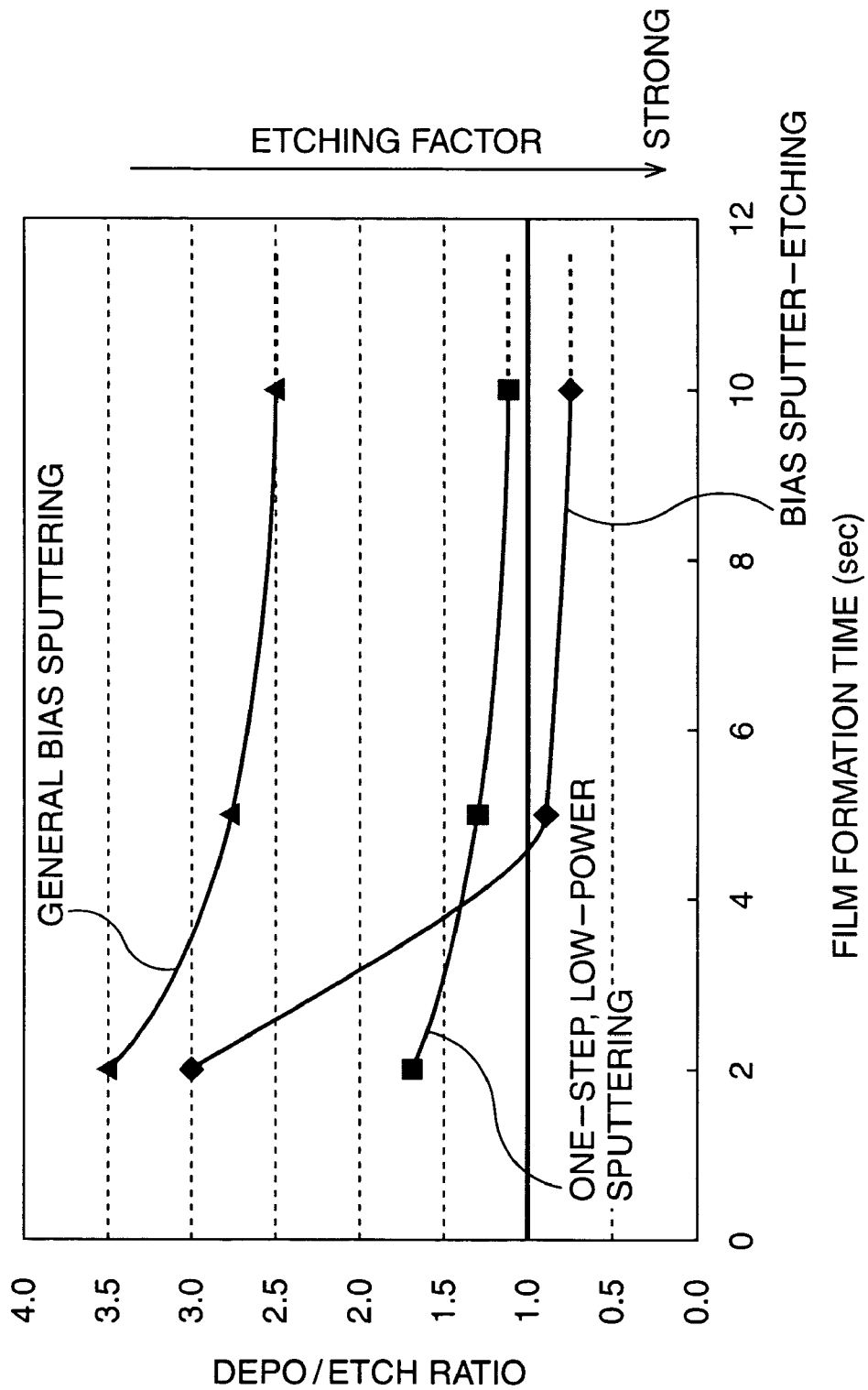

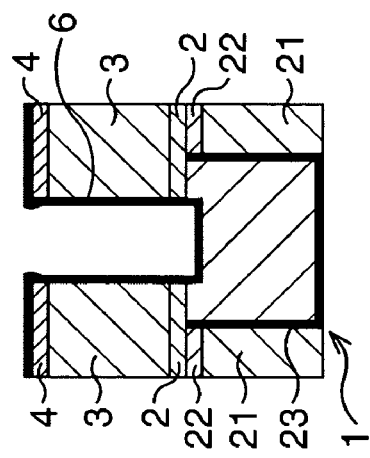
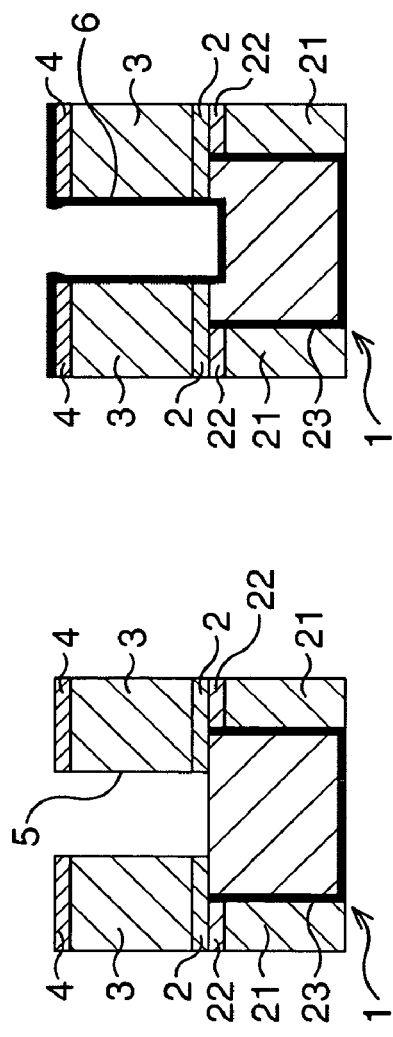
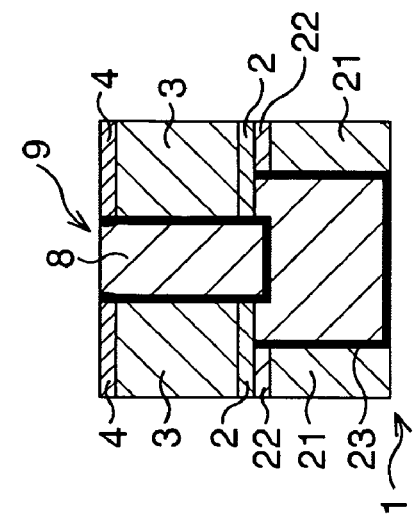
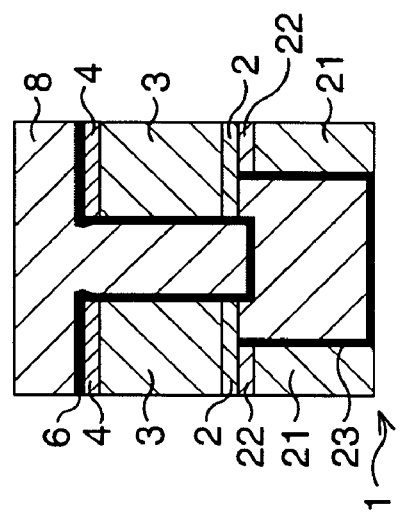
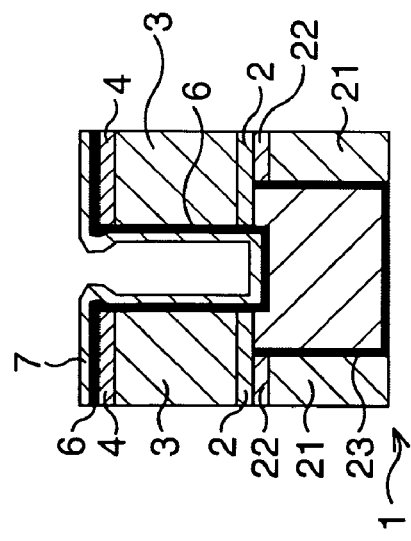

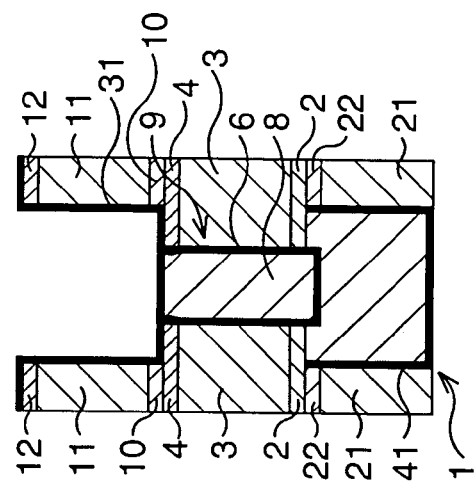
FIG. 8A
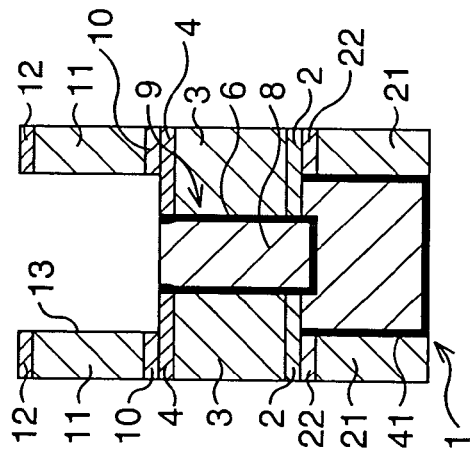
FIG. 8B
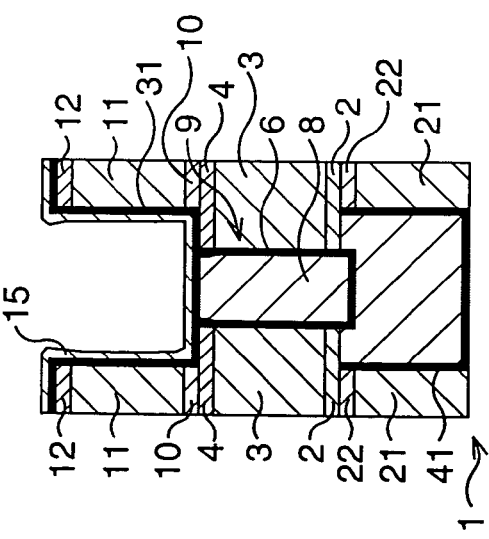
FIG. 8C
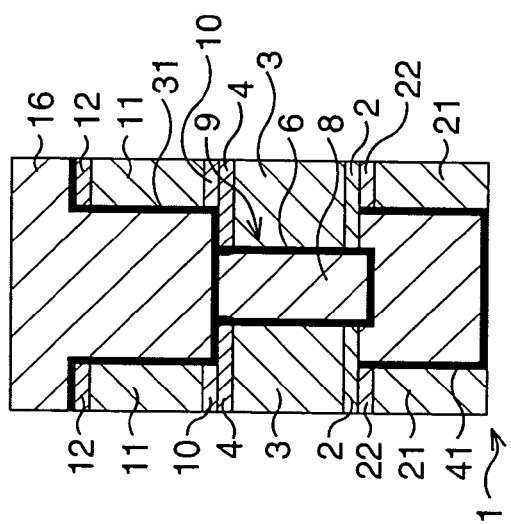
FIG. 8D
FIG. 8E

METHOD OF FORMING WIRING STRUCTURE AND SEMICONDUCTOR DEVICE

CROSS-REFERENCE TO RELATED APPLICATIONS

This application is based upon and claims the benefit of priority from the prior Japanese Patent Application No. 2004-064486, filed on Mar. 8, 2004, the entire contents of which are incorporated herein by reference.

BACKGROUND OF THE INVENTION

1. Field of the Invention

The present invention relates to a method of forming wiring structure and a semiconductor device, and in particular to a technique preferably applicable to so-called dual damascene process in which a connection hole and a wiring groove are separately formed in an insulating film on a semiconductor substrate, and a Cu wiring is formed using Cu (alloy) as a conductive material.

2. Description of the Related Art

There are accelerated trends in micronization and introduction of multi-layered wiring structure as semiconductor devices are becoming more highly integrated and chip size is shrunk. In logic device having such multi-layered wiring structure, wiring delay is becoming a dominant factor of device signal delay. The device signal delay is in proportion to a product of wiring resistance and wiring capacitance, so that reduction in the wiring resistance and wiring capacitance is important in order to improve the wiring delay.

One known investigation for reducing the wiring resistance is made on use of Cu, which is a low-resistance metal, as a material forming the wiring. It is, however, extremely difficult to pattern Cu to form the wiring, so that there is proposed a method, so-called dual damascene process, in which a connection hole (via-hole) and a wiring groove are formed in an insulating film, which are later filled with Cu to form the wiring.

The damascene process is roughly classified into single damascene process in which the via-hole and wiring groove are separately formed, and dual damascene process in which the via-hole and wiring groove are formed at the same time. The dual damascene process may be supposed to enjoy more opportunities of use in consideration of an advantage of reducing the number of process steps, but a disadvantage thereof resides in its narrow process margin because the via-hole and wiring groove must be processed at the same time. In particular in recent advancement in micronization of the wiring, a margin allowable for the pattern processing is becoming narrower, and this raises public attention to the single damascene process which can ensure a wider process margin than in the dual damascene process.

[Patent Document 1] Japanese Patent Application No. 2002-318674

SUMMARY OF THE INVENTION

According to one aspect of the present invention, a method of fabricating a wiring structure is provided, wherein the method comprising the steps of: forming a connection hole in a first insulating film on a substrate; forming, under a first film forming mode, a first underlying film on the first insulating film to cover the inner wall surface of the connection hole; filling the connection hole with a first conductive material while placing the first underlying film thereunder; removing the first conductive material and the first underlying film on the first insulating film to leave the first conductive material only in the connection hole; forming a second insulating film to cover the top surface of the first conductive material; forming a groove in the second insulating film to expose the top surface of the first conductive material; forming, under a second film forming mode which differs from the first film forming mode, a second underlying film on the second insulating film to cover the inner wall surface of the groove; and filling the groove with a second conductive material while placing the second underlying film thereunder.

According to another aspect of the present invention, a semiconductor device is provided, wherein the semiconductor device comprising a semiconductor substrate; a first insulating film disposed on the semiconductor substrate and having a connection hole formed therein; a first underlying film covering the inner wall surface of the connection hole; a first conductive material filling the connection hole while placing the first underlying film thereunder; a second insulating film formed on the first insulating film and having a groove in which the top surface of the first conductive material is disposed; a second underlying film covering the inner wall surface of the groove; and a second conductive material filling the groove while placing the second underlying film thereunder, wherein the first underlying film is formed over the inner wall surface of the connection hole so that the thickness measured on the bottom falls within a range from 0% to 150% of the thickness measured on the side wall surface, and the second underlying film is formed over the inner wall surface of the groove so that the thickness measured on the bottom falls within a range from 70% to 130% of the thickness measured on the side wall surface.

BRIEF DESCRIPTION OF THE DRAWINGS

FIGS. 2A and 2B are schematic sectional views showing states of forming a barrier metal film in a via-hole by various types of sputtering process;

FIG. 3 is a characteristic chart showing quantitative relations between the film formation time and ratio (Vd/Ve) in the bias sputtering process;

FIGS. 4A to 4E are schematic sectional views sequentially showing process steps forming a wiring structure according to a first embodiment;

FIGS. 8A to 8E are schematic sectional views sequentially showing process steps forming a wiring structure according to a second embodiment, as continued from FIG. 7E.

DETAILED DESCRIPTION OF THE PREFERRED EMBODIMENTS

Figure 1A:
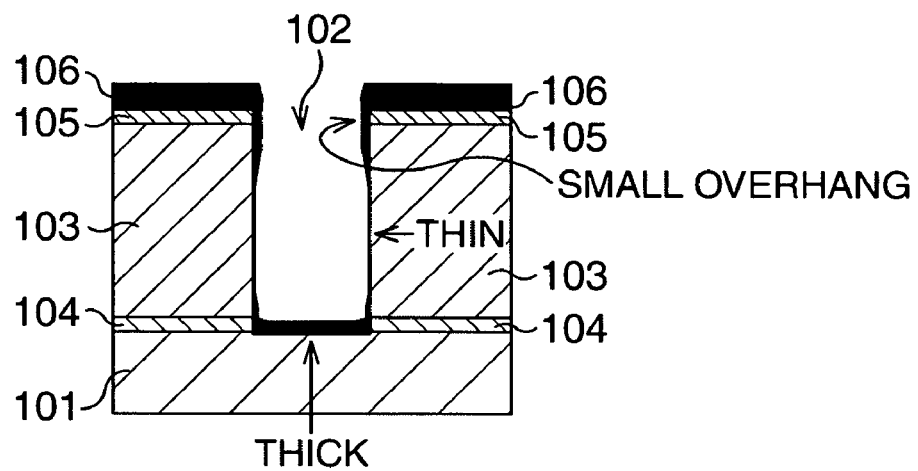
FIGS. 1A and 1B are schematic sectional views showing states of forming a barrier metal film in a via-hole by various types of sputtering process.

In the formation of Cu wiring in the dual damascene process, a step of forming an underlying film (barrier metal film) covering the inner wall of the via-hole and wiring groove before deposition of Cu is indispensable in order to prevent Cu from diffusing into the insulating film. Mode of coverage of the via-hole and wiring groove by the barrier metal film (barrier coverage) largely affects electric characteristics such as via-hole resistance and wiring resistance, and wiring reliabilities such as Cu filling property and electro-migration resistance. In order to satisfy desired wiring characteristics under advancing trends in micronization of the wiring, the barrier coverage cannot exempt from being complicated and detailed. The current situation is, however, such that any preferable technique capable of addressing the above-described needs has not been proposed not only with respect to the dual damascene process in which the barrier metal film is formed intrinsically in the via-hole and wiring groove at the same time, but also with respect to the single damascene process in which the via-hole and wiring groove are separately processed.

Basic Gist of the Present Invention

To respond recent demands for micronization of Cu wiring, it is necessary to respectively consider a preferable barrier coverage over the via-hole and wiring groove. More specifically, it is indispensable, as for the barrier coverage over the via-hole, to thin the barrier metal film at the bottom portion in view of lowering the contact resistance, to ensure a sufficient thickness of the barrier metal film at the side wall portion in view of improving the wiring reliability, and to prevent so-called overhang from occurring in the vicinity of the shoulder portion of the via-hole in view of avoiding failure in the filling. On the other hand, as for the barrier coverage over the wiring groove, it is desired to thin the barrier metal film as a whole in view of suppressing the wiring resistance.

It is difficult for the dual damascene process to satisfy all of the above-described demands because the barrier metal film is formed over the via-hole and wiring groove at the same time. The present invention adopts the single damascene process in which the barrier metal film is formed separately over the via-hole and wiring groove, and moreover the barrier metal film is formed under different film forming modes (not only film forming conditions such as pressure, power, etc., but also film forming method) over the via-hole and wiring groove, aiming at optimizing the barrier coverage as described in the above.

(Film Forming Condition over Via-Hole)

In the film forming process of the barrier metal film over the via-hole, requirements on the mode of coverage of the barrier metal film (barrier coverage) include (1) thinning of the barrier metal film at the bottom portion for the purpose of reducing the contact resistance, (2) securement of a sufficient thickness of the barrier metal film on the side wall surface for the purpose of improving the wiring reliability, and (3) suppression of overhang for the purpose in avoiding failure of Cu filling by electro-plating.

FIGS. 1A, 1B and FIGS. 2A, 2B are schematic sectional views showing states of forming the barrier metal film in the via-hole by various types of sputtering process.

Figure 1B:
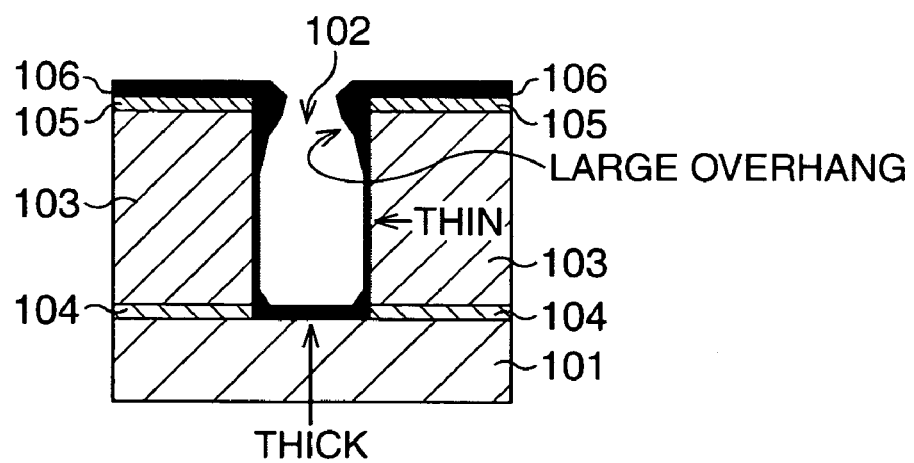

In the case shown herein where a via-hole 102 connecting a lower wiring 101 to an unillustrated upper wiring is formed in an inter-layer insulating film 103 by using an etching stopper film 104 and a hard mask 105, a Ta barrier metal film 106 is formed on the inter-layer insulating film 103 by the sputtering process to cover the inner wall of the via-hole 102, and Cu 107 is then deposited by plating to fill the via-hole 102. FIG. 1A shows a case where the long slow sputtering process is adopted as the sputtering process forming the barrier metal film 106, FIG. 1B shows a case where the bias sputtering process is adopted, FIG. 2A shows a case where the multi-step sputtering process is adopted, and FIG. 2B shows a case where the one-step, low-power sputtering process is adopted.

The long slow sputtering process adopted herein refers to a technique allowing the film formation to proceed under setting of a distance between the substrate and a target longer than that in the general process. In an exemplary case shown in FIG. 1A, the sputtering is proceeded under a target power of 10 kW to 20 kW, and a pressure of $4 \times 10^{-2}$ Pa, without applying substrate bias power.

The bias sputtering process refers to a technique allowing the film formation to proceed while applying bias power to the substrate. In an exemplary case shown in FIG. 1B, the sputtering is proceeded under a target power of 10 kW to 20 kW, a pressure of $4 \times 10^{-2}$ Pa, and a substrate bias of 200 W to 500 W.

The multi-step sputtering process refers to a technique allowing two or more steps of sputtering to proceed, in which sputter-deposition and sputter-etching are combined. In an exemplary case shown in FIG. 2A, the long slow sputtering in a first step is proceeded under a target power of 10 kW to 20 kW, a pressure of $4 \times 10^{-2}$ Pa, and a substrate bias of 0 W to 300 W, and the bias sputter-etching in a second step is proceeded under a target power of 0.2 kW to 5 kW, a pressure of $3 \times 10^{-1}$ Pa to $7 \times 10^{-1}$ Pa, and a substrate bias of 200 W to 500 W.

The one-step, low-power sputtering process, which is a sort of bias sputtering process, refers to a technique allowing the film formation to proceed while setting the target power lower than that in the general bias sputtering process. In an exemplary case shown in FIG. 2B, the sputtering is proceeded under a target power of 0.1 kW to 5 kW, a pressure of $4 \times 10^{-2}$ Pa, and a substrate bias of 100 W to 450 W.

The above-described three requirements (1) to (3) can be achieved by adopting the multi-step sputtering process. In the multi-step sputtering process, first the barrier metal film 106 of an appropriate thickness is formed on the bottom of the via-hole 102, the barrier metal film 106 on the bottom surface is then subjected to the sputter-etching, to thereby add the thickness of the barrier metal film 106 on the bottom surface and side wall surface.

In the bias sputtering process herein, proper selection of film forming conditions makes it possible to regulate the ratio (Vd/Ve) of deposition rate (Vd) of sputtered particles incident on the semiconductor substrate, and etch rate (Ve) of the deposited film which is re-sputtered out from the substrate.

FIG. 3 is a characteristic chart showing quantitative relations between the film formation time and ratio (Vd/Ve) in the bias sputtering process of the barrier metal film. The sputtering herein followed the normal bias sputtering process under conditions of a target power of 10 kW, a pressure of $4 \times 10^{-2}$ Pa and a substrate bias of 200 W, and the bias sputter-etching was proceeded under conditions of a target power of 0.5 kW, a pressure of $3 \times 10^{-1}$ Pa to $7 \times 10^{-1}$ Pa, and a substrate bias of 200 W.

In the general bias sputtering process, it is usual to proceed the film formation while setting the ratio of Vd/Ve to 2.5 or above, in view of maintaining a certain level of rate of film formation. In this range of Vd/Ve, the rate of deposition surpasses the rate of etching, showing only a small re-sputtering effect. In this case, it is necessary to increase the substrate bias in order to secure a sufficient coverage ratio on the side wall surface of the opening pattern, but this results in nonconformities such as increase in overhang, increase in particles during the film formation, and difficulty in thinning.

In the bias sputter-etching based on the multi-step sputtering, the ratio of Vd/Ve is often selected in a range of less than 1 (approximately 0.75, for example) for the purpose of enhancing the etching factor. Because Ta ion, which is a source material for the film, has only a small contribution in this range, and instead Ar ion has a large etching effect, the film formation proceeds without causing almost no deposition of the film material. The etching effect tends to increase as the pressure during the film formation (pressure of an Ar atmosphere) is raised higher, may increase omission of the film at the shoulder portion or the opening pattern or at the bottom surface in the inner wall surface of the opening pattern, either of which is highly causative of nonconformities such as Cu diffusion into the insulating film in association with inter-wiring shortcircuiting and misalignment of the opening pattern.

In one-step, low-power sputtering process, the film formation is proceeded while setting the film formation conditions so that the ratio Vd/Ve is adjusted to 1<Vd/Ve<2 over the entire period of film formation. The film formation within the range is successful in obtaining a thin and uniform barrier metal film over the entire portion of the inner wall surface in the opening pattern. That is, in this case, supply of Ta ion and re-sputtering by Ar ion are balanced, wherein the local etching at the shoulder portion and the bottom surface of the opening pattern is suppressed, and a constant amount of Ta is maintained also on the bottom surface. It is also expected that thickening of the film on the side wall surface of the via-hole appropriately proceeds by the re-sputtering effect, and this consequently makes it possible to obtain a thin and uniform barrier metal film showing an excellent coverage ratio over the entire portion of the inner wall surface of the opening pattern.

The present invention adopts the multi-step sputtering process for the formation of the barrier metal film over the via-hole, wherein the conditions for the low-power film formation are set to satisfy Vd/Ve>1 for the first step, and to satisfy Vd/Ve<1 for the second step. In this case, relation between the barrier coverage on the side wall surface and on the bottom surface of the inner wall of the via-hole is preferably adjusted so that the thickness measured on the bottom falls within a range from 0% to 150% of the thickness measured on the side wall surface, and the film forming conditions for the individual steps are adjusted to achieve this ratio of film thickness. The range of Vd/Ve<1 may occasionally result in omission of the barrier metal film on the bottom surface, and this is solved by adjusting the conditions for the second step to suppress the omission within a range from 0 nm to 100 nm or around.

(Film Forming Condition over Wiring Groove)

In the film formation process over the wiring groove, a requirement for the barrier coverage resides in thinning of the barrier metal on the inner wall (side wall surface and bottom surface) of the wiring groove for the purpose of reducing the wiring resistance. The one-step, low-power sputtering shown in FIG. 2B is preferable to satisfy the requirement.

In the one-step, low-power sputtering, the barrier metal film can be formed over the side wall surface and bottom surface in the inner wall of the opened pattern with a desirable coverage ratio, as described in the above in relation to Vd/Ve. It is therefore made possible to thin the barrier metal while keeping uniformity in the thickness unchanged, by optimizing conditions of the film formation.

In this case, the barrier coverage over the inner wall of the wiring groove is such that the thickness of the barrier metal film measured on the bottom falls within a range from 70% to 130% of the thickness measured on the side wall surface, so that film forming conditions are adjusted to achieve such ratio of the film thickness. A method of film formation over the wiring groove may be chemical vapor deposition (CVD process). In the film formation by the CVD process, the film deposition proceeds while keeping a uniform film thickness over the wiring pattern (conformal growth). This is successful in achieving thinning of the barrier metal film while keeping the ratio of the film thickness within a range from 70% to 130%. Adoption of the ALD (atomic layer deposition) process as the method of film formation over the wiring groove also results in the similar barrier coverage.

(Relation between Film Forming Conditions over Via-Hole and Wiring Groove)

Considering the requirements for the barrier metal film with respect to the via-hole and wiring groove, it is preferable to set a ratio of thickness of the barrier metal measured on the bottom and on the side wall surface of the via-hole smaller than a ratio of the thickness of the barrier metal measured on the bottom and on the side wall surface of the wiring groove. This is achieved by adopting the multi-step sputtering process for the via-hole, and by adopting the one-step, low-power sputtering process for the wiring groove as described in the above.

Concrete Embodiments of the Present Invention

The following paragraphs will describe various specific embodiments of the present invention applied to the formation of Cu wiring (and via-hole connection) based on the damascene process.

First Embodiment

FIGS. 4A to 5E are schematic sectional views sequentially showing process steps of a method of wiring formation according to a first embodiment.

First, as shown in FIG. 4A, semiconductor element such as MOS transistor or the like is formed on the semiconductor substrate, not shown, and the lower wiring 1 is then formed to be connected to the semiconductor element. The lower wiring 1 is formed by plating to fill the wiring groove formed in an inter-layer insulating film 21 and an etching stopper film 22, while placing a barrier metal film 23 thereunder. The barrier metal film 23 is formed typically by the one-step, low-power sputtering process similarly to the barrier metal film 14 described later.

Next, an etching stopper film 2 of approximately several tens of nanometers thick is formed on the lower wiring 1 using a material such as SiO+SiC, and an inter-layer insulating film 3 of approximately several hundreds of nanometers thick is formed on the etching stopper film 2 using an organic or inorganic insulating material by the SOG process or CVD process. A hard mask 4, having an opening, is then formed on the inter-layer insulating film 3 using a material such as SiO+SiC, and the inter-layer insulating film 3 is plasma-etched through the hard mask 4 to thereby form a via-hole 5 having a diameter of 0.1 µm to 0.15 µm or around, and a depth of 300 nm to 700 nm or around (aspect ratio>2.5). Etching gas available herein includes CF-base gases, NH$_3$-base gases and N$_2$/H$_2$ gas. In this process, the opening is formed also in the etching stopper film 2, so that the surface of the lower wiring 1 exposes at the bottom of the via-hole 5.

Next as shown in FIG. 4B, a barrier metal film 6 is formed, using Ta (or TaN) as a source material, on the hard mask 4 by the multi-step sputtering in two steps, to cover the inner wall surface of the via-hole 5. More specifically, the first step adopts film forming conditions satisfying Vd/Ve>1, which are typified by a target power of 10 kW to 20 kW, a pressure of $4 \times 10^{-2}$ Pa, and a substrate bias of 0 W to 300 W, to attain a thickness of the deposited film of 3 nm to 20 nm in the field portion (portion other than the target area for formation of the barrier metal film, which is specifically on the hard mask 4 herein). It is also allowable in the first step to adopt the long slow sputtering process, in place of the multi-step sputtering process, setting the substrate bias to 0 W. The second step in the next adopts film forming conditions satisfying Vd/Ve<1, which are typified by a target power of 0.2 kW to 5 kW, a pressure of $3 \times 10^{-1}$ Pa to $7 \times 10^{-1}$ Pa, a substrate bias of 200 W to 500 W, and a film formation time of 5 seconds to 20 seconds, to thereby form the barrier metal film 6.

Next, as shown in FIG. 4C, a seed metal film 7 is formed by sputtering on the inter-layer insulating film 3 using Cu as a source material, to cover the inner wall surface of the via-hole 5 while placing the barrier metal film 6 thereunder. Sputtering conditions adopted herein are typified by a target power of 5 kW to 30 kW, a pressure of $1 \times 10^{-5}$ Pa to 10 Pa, and a substrate bias of 200 W to 500 W, and thereby the seed metal film 7 is formed to a thickness of 40 nm to 150 nm or around.

Next as shown in FIG. 4D, the via-hole 5 is filled with Cu 8 by the plating process using the seed metal layer 7 as an electrode. In this process, a copper sulfate bath is used, and the Cu 8 is deposited to a thickness of 500 nm to 2,000 nm or around under an electric current density of 7 $A/cm^2$ to 30 $A/cm^2$.

Next, as shown in FIG. 4E, a portion of Cu 8 and the barrier metal film 6 on the hard mask 4 are polished off by the CMP process typically using the hard mask 4 as a stopper, using an organic acid slurry, to thereby form a via-plug 9 which is composed of Cu 8 filled in the via-hole 5 while placing the barrier metal film 6 thereunder.

Figure 5A:
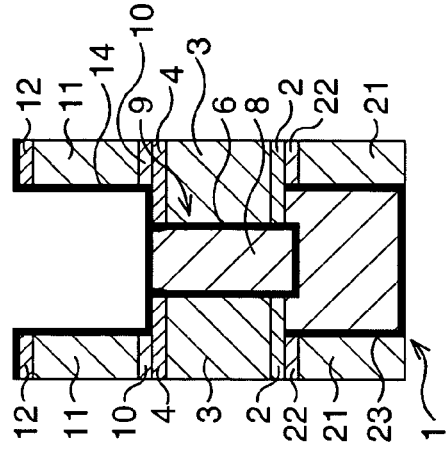
FIGS. 5A to 5E are schematic sectional views sequentially showing process steps forming a wiring structure according to a first embodiment, as continued from FIG. 4E.

Next, as shown in FIG. 5A, an etching stopper film 10 of approximately several tens of nanometers thick is formed on the hard mask 4 using a material such as SiO+SiC, and an inter-layer insulating film 11 of approximately several hundreds of nanometers thick is formed on the etching stopper film 10 using an organic or inorganic insulating material by the SOG process or CVD process. A hard mask 12, having an opening, is then formed on the inter-layer insulating film 11 using a material such as SiO+SiC, and the inter-layer insulating film 11 is plasma-etched through the hard mask 12 to thereby form a wiring groove 13 having a width of 0.1 μm to 3.0 μm or around, and a depth of several hundreds of nanometers. Etching gas available herein includes CF-base gases, $NH_3$-base gases and $N_2/H_2$ gas. In this process, the opening is formed also in the etching stopper film 10, so that the surface of the via-plug 9 exposes at the bottom of the wiring groove 13.

Figure 5B:
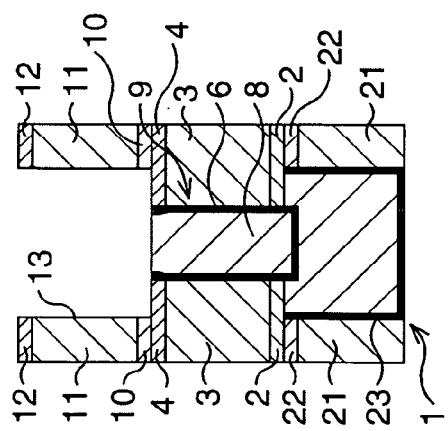
Figure 5E:
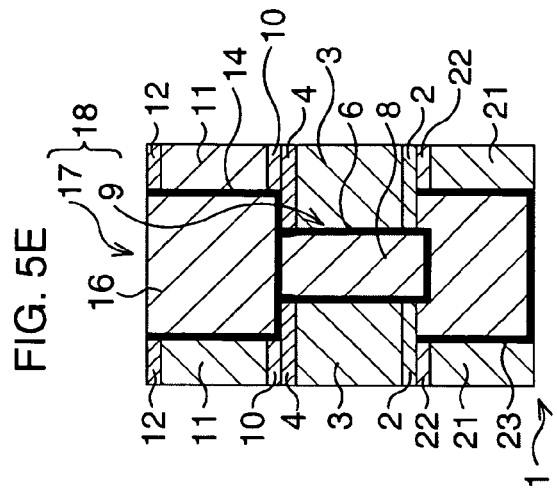

Next, as shown in FIG. 5B, the barrier metal film 14 is formed by the one-step, low-power sputtering process to cover the inner wall surface of the wiring groove 13. More specifically, the process herein adopts conditions satisfying 1<Vd/Ve<2, which are typified by a target power of 0.2 kW to 5 kW, a pressure of $4 \times 10^{-2}$ Pa, and a substrate bias of 150 W to 450 W. Sputtering under these conditions using Ta (or TaN) as a source material results in formation of the barrier metal film 14, having a uniform thickness of 5 nm or less, covering the inner wall surface of the wiring groove 13, without causing almost no deposition of Ta on the field portion (portion on the hard mask 12 herein). Next, as shown in FIG. 5C, a seed metal film 15 is formed by sputtering on the inter-layer insulating film 11 using Cu as a source material, to cover the inner wall surface of the wiring groove 13 while placing the barrier metal film 14 thereunder. Sputtering conditions adopted herein are typified by a target power of 5 kW to 30 kW, a pressure of $1 \times 10^{-5}$ Pa to 10 Pa, and a substrate bias of 200 W to 500 W, and thereby the seed metal film 15 is formed to a thickness of 40 nm to 150 nm or around.

Figure 5D:
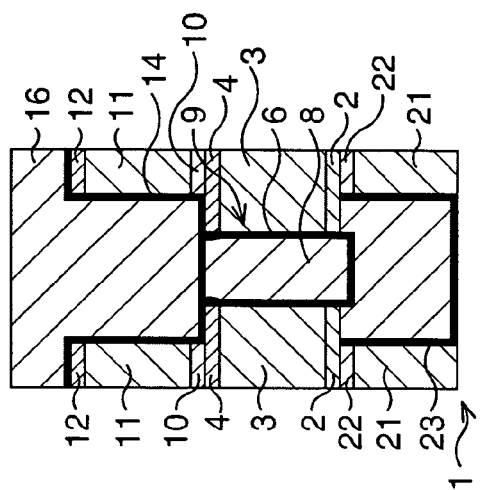
Figure 5C:
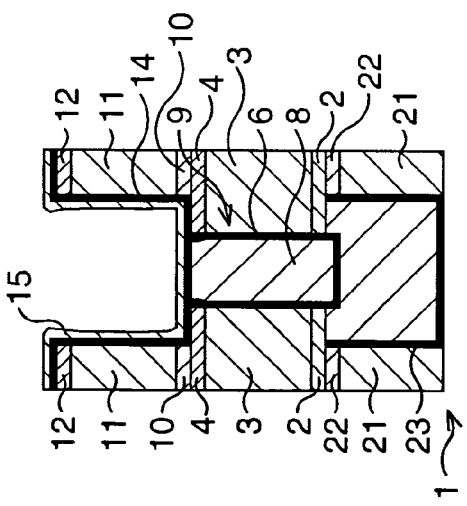

Next as shown in FIG. 5D, the wiring groove 13 is filled with Cu 16 by the plating process using the seed metal layer 15 as an electrode. In this process, a copper sulfate bath is used, and the Cu 16 is deposited to a thickness of 500 nm to 2,000 nm or around under an electric current density of 7 $A/cm^2$ to 30 $A/cm^2$.

Next, as shown in FIG. 5E, a portion of Cu 16 and the barrier metal film 14 on the hard mask 12 are polished off by the CMP process typically using the hard mask 12 as a stopper, using an organic acid slurry, to thereby form a wiring layer 17 which is composed of Cu 16 filled in the wiring groove 13 while placing the barrier metal film 14 thereunder. This completes a wiring structure 18 having a single-damascene-structure by which the via-plug 9 and the wiring layer 17 are electrically connected.

A semiconductor device, having semiconductor elements such as MOS transistors and wiring structures connected thereto, is finally completed after going through further process steps forming insulating films and wiring structures.

It is to be noted herein that the sputtered material for forming the barrier metal films 6, 14 may be at least any one refractory metal selected from Ti, W, Zr, V and nitrides thereof, in place of Ta. The film formation step is preceded by preliminary steps such as discharge initiation step, discharge stabilization step, discharge termination step and substrate charge erasure step. In some cases, the substrate charge erasure step is omissible. It is also allowable to use, as a material composing the seed metal film 7, 15, a Cu alloy containing Al, Ti, Zr, Ni, Ag, Pd or the like, in place of pure Cu.

Figure 6A:
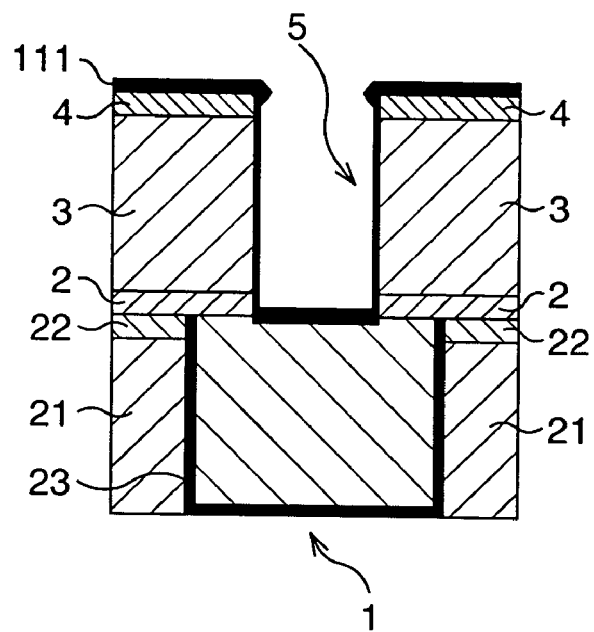
FIGS. 6A and 6B are schematic sectional views showing process steps forming a barrier metal film in formation of a wiring structure according to the conventional single damascene process, as a comparative example of the present invention.
Figure 6B:
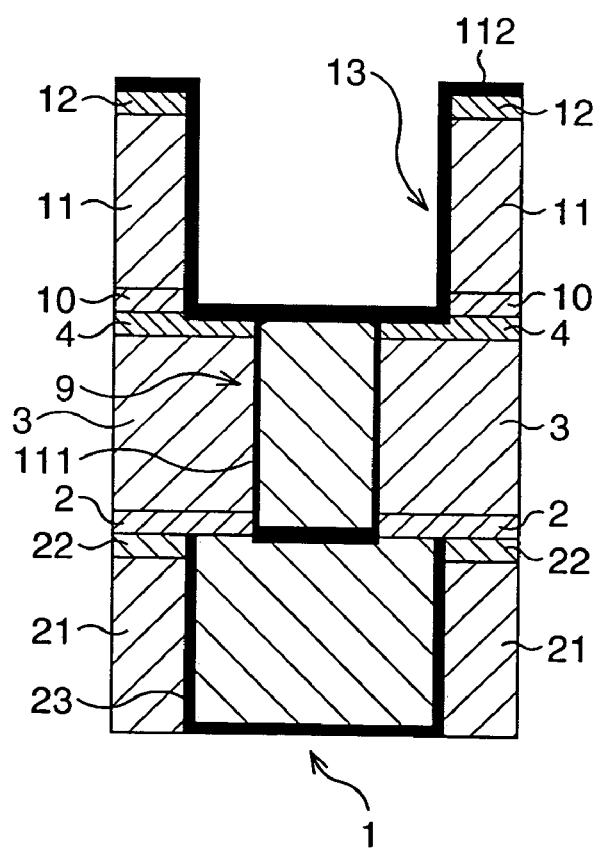

The following paragraphs will describe, as a comparative example in contrast to the present invention, a film formation process of the barrier metal in the formation of the wiring structure according to the conventional single damascene process. In the conventional process, as shown in FIG. 6, both of formation of a barrier metal film 111 on the inner wall surface of the via-hole 5 and formation of a barrier metal film 112 on the inner wall surface of the wiring groove 13 are proceeded under the same film forming conditions according to the bias sputtering process. More specifically, the barrier metal films 111, 112 are formed to a thickness of 10 nm to 30 nm or around, under a target power of 10 kW to 20 kW, a pressure of $4 \times 10^{-2}$ Pa, and a substrate bias of 200 W to 500 W.

In the comparative example, the barrier metal films 111, 112 are formed without separately considering the film forming conditions, and this inevitably fails in forming the barrier metal layer of a desired thickness on both inner wall surfaces of the via-hole and wiring groove, because the via-hole and wiring groove differ from each other in a required level of barrier coverage.

In contrast to this, the method of forming a wiring structure according to this embodiment optimizes modes of film formation of the individual barrier metal films 6, 14 as being adapted respectively to the via-hole 5 and wiring groove 13, for example by adopting the multi-step sputtering process for the barrier metal film 6, and by adopting the one-step, low-power sputtering process for the barrier metal film 14. It is therefor made possible to realize a micronized wiring structure with improved electric characteristics such as via-hole resistance and wiring resistance, and improved wiring reliabilities such as Cu filling property and electro-migration resistance.

Second Embodiment

FIGS. 7A to 8E are schematic sectional views sequentially showing process steps of a method of wiring formation according to a second embodiment.

Figure 7A:
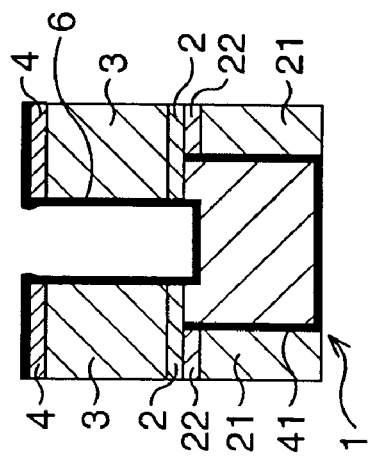
FIGS. 7A to 7E are schematic sectional views sequentially showing process steps forming a wiring structure according to a second embodiment.

First, as shown in FIG. 7A, semiconductor element such as MOS transistor or the like is formed on the semiconductor substrate, not shown, and the lower wiring 1 is then formed to be connected to the semiconductor element. The lower wiring 1 is formed by plating to fill the wiring groove formed in an inter-layer insulating film 21 and an etching stopper film 22, while placing a barrier metal film 41 thereunder. The barrier metal film 41 is formed typically by the CVD process similarly to the barrier metal film 31 described later.

Next, an etching stopper film 2 of approximately several tens of nanometers thick is formed on the lower wiring 1 using a material such as SiO+SiC, and an inter-layer insulating film 3 of approximately several hundreds of nanometers thick is formed on the etching stopper film 2 using an organic or inorganic insulating material by the SOG process or CVD process. A hard mask 4, having an opening, is then formed on the inter-layer insulating film 3 using a material such as SiO+SiC, and the inter-layer insulating film 3 is plasma-etched through the hard mask 4 to thereby form a via-hole 5 having a diameter of 0.1 µm to 0.15 µm or around, and a depth of 300 nm to 700 nm or around (aspect ratio >2.5). Etching gas available herein includes CF-base gases, $NH_3$-base gases and $N_2/H_2$ gas. In this process, the opening is formed also in the etching stopper film 2, so that the surface of the lower wiring 1 exposes at the bottom of the via-hole 5.

Figure 7B:
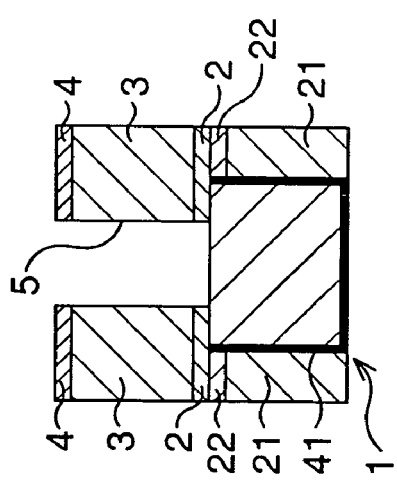

Next as shown in FIG. 7B, a barrier metal film 6 is formed, using Ta (or TaN) as a source material, on the hard mask 4 by the multi-step sputtering in two steps, to cover the inner wall surface of the via-hole 5. More specifically, the first step adopts film forming conditions satisfying Vd/Ve>1, which are typified by a target power of 10 kW to 20 kW, a pressure of $4\times10^{-2}$ Pa, and a substrate bias of 0 W to 300 W, to attain a thickness of the deposited film of 3 nm to 20 nm in the field portion (portion other than the target area for formation of the barrier metal film, which is specifically on the hard mask 4 herein). It is also allowable in the first step to adopt the long slow sputtering process, in place of the multi-step sputtering process, setting the substrate bias to 0 W. The second step in the next adopts film forming conditions satisfying Vd/Ve<1, which are typified by a target power of 0.2 kW to 5 kW, a pressure of $3\times10^{-1}$ Pa to $7\times10^{-1}$ Pa, a substrate bias of 200 W to 500 W, and a film formation time of 5 seconds to 20 seconds, to thereby form the barrier metal film 6.

Figure 7E:
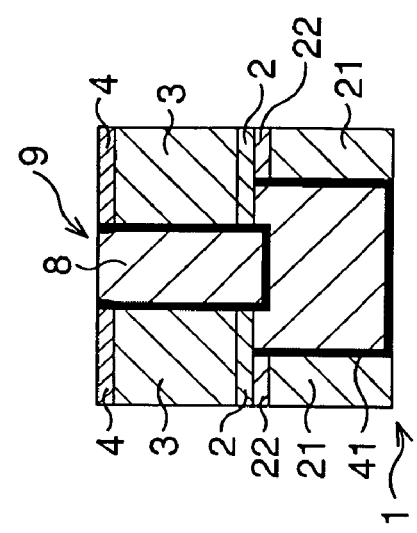
Figure 7D:
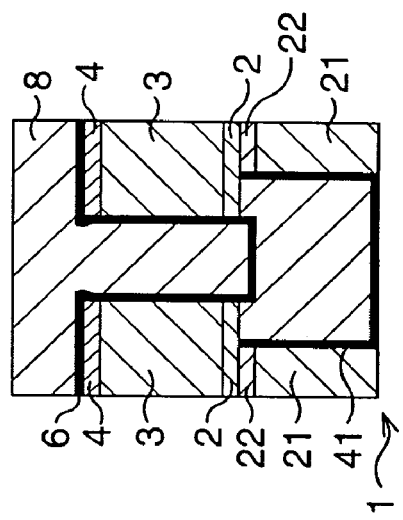
Figure 7C:
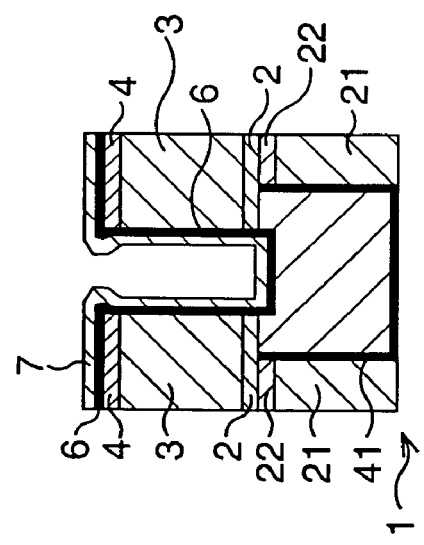

Next, as shown in FIG. 7C, a seed metal film 7 is formed by sputtering on the inter-layer insulating film 3 using Cu as a source material, to cover the inner wall surface of the via-hole 5 while placing the barrier metal film 6 thereunder. Sputtering conditions adopted herein are typified by a target power of 5 kW to 30 kW, a pressure of $1\times10^{-5}$ Pa to 10 Pa, and a substrate bias of 200 W to 500 W, and thereby the seed metal film 7 is formed to a thickness of 40 nm to 150 nm or around.

Next as shown in FIG. 7D, the via-hole 5 is filled with Cu 8 by the plating process using the seed metal layer 7 as an electrode. In this process, a copper sulfate bath is used, and the Cu 8 is deposited to a thickness of 500 nm to 2,000 nm or around under an electric current density of 7 $A/cm^2$ to 30 $A/cm^2$.

Next, as shown in FIG. 7E, a portion of Cu 8 and the barrier metal film 6 on the hard mask 4 are polished off by the CMP process typically using the hard mask 4 as a stopper, using an organic acid slurry, to thereby form a via-plug 9 which is composed of Cu 8 filled in the via-hole 5 while placing the barrier metal film 6 thereunder.

Next, as shown in FIG. 8A, an etching stopper film 10 of approximately several tens of nanometers thick is formed on the hard mask 4 using a material such as SiO+SiC, and an inter-layer insulating film 11 of approximately several hundreds of nanometers thick is formed on the etching stopper film 10 using an organic or inorganic insulating material by the SOG process or CVD process. A hard mask 12, having an opening, is then formed on the inter-layer insulating film 11 using a material such as SiO+SiC, and the inter-layer insulating film 11 is plasma-etched through the hard mask 12 to thereby form a wiring groove 13 having a width of 0.1 µm to 3.0 µm or around, and a depth of several hundreds of nanometers. Etching gas available herein includes CF-base gases, $NH_3$-base gases and $N_2/H_2$ gas. In this process, the opening is formed also in the etching stopper film 10, so that the surface of the via-plug 9 exposes at the bottom of the wiring groove 13.

Next, as shown in FIG. 8B, a barrier metal film 31 is formed by the CVD process to cover the inner wall surface of the wiring groove 13. More specifically, $Ti[N(C_2H_5)_2]_4$ (tetrakis(diethylamido) titanium(IV)) is used as a source gas, and CVD is proceeded under a film forming pressure of 50 Pa to 100 Pa, and a film forming temperature of 350° C. to 450° C., to thereby form the barrier metal film 31 having a uniform thickness of 1 nm to 5 nm to cover the inner wall surface of the wiring groove 13.

Next, as shown in FIG. 8C, a seed metal film 15 is formed by sputtering on the inter-layer insulating film 11 using Cu as a source material, to cover the inner wall surface of the wiring groove 13 while placing the barrier metal film 31 thereunder. Sputtering conditions adopted herein are typified by a target power of 5 kW to 30 kW, a pressure of $1\times10^{-5}$ Pa to 10 Pa, and a substrate bias of 200 W to 500 W, and thereby the seed metal film 15 is formed to a thickness of 40 nm to 150 nm or around.

Next as shown in FIG. 8D, the wiring groove 13 is filled with Cu 16 by the plating process using the seed metal layer 15 as an electrode. In this process, a copper sulfate bath is used, and the Cu 16 is deposited to a thickness of 500 nm to 2,000 nm or around under an electric current density of 7 $A/cm^2$ to 30 $A/cm^2$.

Next, as shown in FIG. 8E, a portion of Cu 16 and the barrier metal film 31 on the hard mask 12 are polished off by the CMP process typically using the hard mask 12 as a stopper, using an organic acid slurry, to thereby form a wiring layer 17 which is composed of Cu 16 filled in the wiring groove 13 while placing the barrier metal film 31 thereunder. This completes a wiring structure 18 having a single-damascene-structure by which the via-plug 9 and the wiring layer 17 are electrically connected.

A semiconductor device, having semiconductor elements such as MOS transistors and wiring structures connected thereto, is finally completed after going through further process steps forming insulating films and wiring structures.

It is to be noted herein that the sputtered material for forming the barrier metal films 6, 31 may be at least any one refractory metal selected from Ti, W, Zr, V and nitrides thereof, in place of Ta. The film formation step is preceded by preliminary steps such as discharge initiation step, discharge stabilization step, discharge termination step and substrate charge erasure step. In some cases, the substrate charge erasure step is omissible. It is also allowable to use, as a material composing the seed metal film 7, 15, a Cu alloy containing Al, Ti, Zr, Ni, Ag, Pd or the like, in place of pure Cu.

As has been described in the above, the present invention makes it possible to realize a micronized wiring structure with improved electric characteristics such as via-hole resistance and wiring resistance, and improved wiring reliabilities such as Cu filling property and electro-migration resistance, by optimizing modes of film formation of the individual barrier metal films 6, 31 as being adapted respectively to a via-hole 5 and a wiring groove 13, for example by adopting the sputtering process (e.g., multi-step sputtering process) for the barrier metal film 6, and by adopting the CVD process for the barrier metal film 31.

The present invention makes it possible to realize a micronized wiring structure with improved electric characteristics such as via-hole resistance and wiring resistance, and improved wiring reliabilities such as Cu filling property and electro-migration resistance, by optimizing modes of film formation of barrier metal films as being adapted respectively to the via-hole and wiring groove.

What is claimed is:

1. A method of forming a wiring structure, wherein
a first conductive material filling a connection hole while placing a first underlying film thereunder, and
a second conductive material filling a groove while placing a second underlying film thereunder
are connected by a single damascene process,
comprising the steps of:
forming said connection hole in a first insulating film on a substrate;
forming, under a first film forming mode, said first underlying film on said first insulating film to cover the inner wall surface of said connection hole;
filling said connection hole with said first conductive material while placing said first underlying film thereunder;
removing said first conductive material and said first underlying film on said first insulating film to leave said first conductive material only in said connection hole;
forming a second insulating film to cover the top surface of said first conductive material;
forming said groove in said second insulating film to expose the top surface of said first conductive material;
forming, under a second film forming mode which differs from said first film forming mode, said second underlying film on said second insulating film to cover the inner wall surface of said groove including the top surface of said first conductive material; and
filling said groove with said second conductive material while placing said second underlying film thereunder;
wherein both said first film forming mode and said second film forming mode adopt sputtering process, but differ in film forming conditions,
wherein, under said first film forming mode, said sputtering process is proceeded in a plurality of sputtering steps including:
a first sputtering step proceeded under setting of Vd/Ve>1, where Vd/Ve being a ratio of deposition rate (Vd) and etch rate (Ve) of said first underlying film; and
a second spattering step proceeded under setting of Vd/Ve<1, where Vd/Ve being a ratio of deposition rate (Vd) and etch rate (Ve) of said first underlying film.

2. The method of forming a wiring structure according to claim 1, wherein said first underlying film and said second underlying film are formed using the same refractory metal material or a nitride material thereof.

3. The method of forming a wiring structure according to claim 1, wherein said first underlying film and said second underlying film are formed using different refractory metal materials or nitride materials thereof.

4. The method of forming a wiring structure according to claim 1, wherein said sputtering process is a bias sputtering process in which film formation is proceeded while applying bias power to said substrate.

5. The method of forming a wiring structure according to claim 4, wherein, under said second film forming mode, said sputtering process is proceeded under setting of 1<Vd/Ve<2, where Vd/Ve being a ratio of deposition rate (Vd) and etch-rate (Ve) of said second underlying film.

6. The method of forming a wiring structure according to claim 5, wherein said sputtering process is proceeded while setting a target power to 0.1 kW to 5.0 kW, both ends inclusive, and said bias power to 100 W to 450 W, both ends inclusive.

7. The method of forming a wiring structure according to claim 1, wherein said first underlying film is formed over the inner wall surface of said connection hole so that the thickness measured on the bottom falls within a range from 0% to 150% of the thickness measured on the side wall surface.

8. The method of forming a wiring structure according to claim 5, wherein said second underlying film is formed over the inner wall surface of said groove so that the thickness measured on the bottom falls within a range from 70% to 130% of the thickness measured on the side wall surface.

9. The method of forming a wiring structure according to claim 1, wherein both of said first conductive material and said second conductive material are composed of copper or a copper-containing material.

* * * * *